(12) United States Patent
Maruyama et al.

(10) Patent No.: US 7,205,855 B2
(45) Date of Patent: Apr. 17, 2007

(54) OSCILLATOR THAT OSCILLATES SIGNALS OF A PREDETERMINED FREQUENCY

(75) Inventors: Sho Maruyama, Kyoto (JP); Takeshi Wakii, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/192,656

(22) Filed: Jul. 29, 2005

(65) Prior Publication Data

US 2005/0258909 A1 Nov. 24, 2005

Related U.S. Application Data

(63) Continuation of application No. PCT/JP2004/007270, filed on May 27, 2004.

(30) Foreign Application Priority Data

May 28, 2003 (JP) .............................. 2003-150326

(51) Int. Cl.
*H03B 1/00* (2006.01)
(52) U.S. Cl. .......................................... 331/74; 331/57
(58) Field of Classification Search ................... 331/74, 331/57; 327/103
See application file for complete search history.

(56) References Cited

U.S. PATENT DOCUMENTS

| | | | |
|---|---|---|---|
| 5,426,398 A | 6/1995 | Kuo | |
| 5,428,318 A * | 6/1995 | Razavi | .......................... 331/57 |
| 5,585,754 A * | 12/1996 | Yamashina et al. | .......... 327/158 |
| 6,198,356 B1 | 3/2001 | Visocchi et al. | |
| 6,229,403 B1 | 5/2001 | Sekimoto | |
| 6,958,631 B2 | 10/2005 | Aiba et al. | |

FOREIGN PATENT DOCUMENTS

| | | |
|---|---|---|
| JP | 63-254814 | 10/1988 |
| JP | 1-305722 | 12/1989 |
| JP | 6-37599 | 2/1994 |

(Continued)

OTHER PUBLICATIONS

International Preliminary Examination report for International Application No. PCT/JP2004/007270 dated Mar. 23, 2006 with English Translation.

(Continued)

*Primary Examiner*—Joseph Chang
(74) *Attorney, Agent, or Firm*—Canon Colburn LLP

(57) ABSTRACT

The distortion component of an oscillation signal is reduced. An oscillation signal generating circuit generates, as oscillation signals, first generation oscillation signal and second generation oscillation signal which are related to each other as a differential signal. A differential amplifier performs differential amplification on the first generation oscillation signal and the second generation oscillation signal, respectively, and outputs first amplification oscillation signal and second amplification oscillation signal. A converter circuit converts the first amplification oscillation signal and the second amplification oscillation signal into an output current oscillation signal of such a form that sink current and source current are alternately switched. In order to convert voltages of the first amplification oscillation signal and the second amplification oscillation signal into currents, a variable current source delivers a converting drive current to drive the converter circuit. The magnitude of the converting drive current can be adjusted by externally adjusting a value of variable resistance contained in the variable current source.

9 Claims, 6 Drawing Sheets

FOREIGN PATENT DOCUMENTS

| | | |
|---|---|---|
| JP | 06-037599 | 2/1994 |
| JP | 8-102646 | 4/1996 |
| JP | 9-36708 | 2/1997 |
| JP | 10-13210 | 1/1998 |
| JP | 10-022794 | 1/1998 |
| JP | 11-17501 | 1/1999 |
| JP | 11-88126 | 3/1999 |
| JP | 2000-244285 | 9/2000 |
| JP | 2001-177380 | 6/2001 |
| JP | 2003-188688 | 7/2003 |
| WO | WO 2004/107575 A1 | 12/2004 |

OTHER PUBLICATIONS

Japanese Office Action for Japanese Patent Application No. 2003-123667 dated Aug. 16, 2005.

Japanese Office Action for Japanese Application No. 2003-123668 dated Nov. 29, 2005.

Japanese Office Action for Patent Application No. 2003-150326 dated Aug. 22, 2006 with an English translation.

B. Razavi, "Design of Analog CMOS Integrated Circuits" (McGraw-Hill, 2001) with English translation.

\* cited by examiner

OSCILLATOR THAT OSCILLATES SIGNALS OF A PREDETERMINED FREQUENCY

CROSS-REFERENCE TO RELATED APPLICATION

The present application is a continuation of PCT/JP2004/007270, filed on May 27, 2004, the entire contents of which are incorporated herein by reference, and which claims the benefit of the date of the earlier filed Japanese Patent Application No. JP 2003-150326 filed on May 28, 2003.

BACKGROUND OF THE INVENTION

1. Field of the Invention

The present invention relates to oscillators, and it particularly relates to an oscillator that oscillates signals of a predetermined frequency.

2. Description of the Related Art

A voltage controlled oscillator is used in optical pickups or phase-locked loops (PLL), for instance. Generally, an oscillation frequency is adjusted according to a control voltage applied and then a signal of the thus adjusted oscillation frequency is outputted. In an example of a conventional voltage controlled oscillator, an inverting amplifier, a first charge/discharge circuit and a second charge/discharge circuit are electrically coupled to form a circuit. In this structure, the phase of an inverted voltage signal from the inverting amplifier is delayed in stages at the first and the second charge/discharge circuit and the output of the second charge/discharge circuit is again inputted to the inverting amplifier. After a full circle, the phase of an inverted voltage signal returns to the same phase as the original one, so that the voltage controlled oscillator can keep oscillating by repeating the above processing. The oscillation frequency of the voltage controlled oscillator is determined mainly in response to the magnitude of the charge/discharge current at the first and the second charge/discharge circuit, and the magnitude of the charge/discharge current is controlled by an easily controllable control current which has a current value level higher than the charge/discharge current (See, for instance, Reference (1) in the following Related Art List).

Related Art List (1) Japanese Patent Application Laid-Open No. Hei06-37599.

According to such conventional technology, the charge/discharge current, even when it is very small, is controlled by control current, so that stable oscillation output can be achieved even at low oscillation frequencies by stabilizing the level of current values for the control. For the oscillation at high oscillation frequencies, on the other hand, there are generally the following problems to be solved. When an oscillation signal at a high oscillation frequency is to be generated and further to be converted from into a current signal by a field effect transistor (FET) (hereinafter this FET will be referred to as "converting FET"), the distortion of an oscillation signal due to the conversion is in general likely to occur. When this distortion results in high-order harmonic contents, the EMI (electromagnetic interference) characteristics tend to deteriorate. Also, when the oscillation frequency of the oscillation signals outputted finally from the oscillator is made high and the amplitude of said oscillation signals is enlarged, the power consumption therefor will generally increase. If the oscillator is incorporated into a battery-driven device or the like, lower power consumption is desired but the conversion efficiency from the voltage signal to the current signal needs to be improved.

On the other hand, the LSI vendors who supply oscillators built in LSIs (large-scale integrated circuits) or the like find it desirable if such LSIs can be used for general purpose to gain mass-production effect. And set makers, who incorporate the LSIs into certain devices or the like, desire that an oscillator sets variably the amplitude of output signals in accordance with a condition required by a device and it operates at low power consumption. For that purpose, the oscillator is required to have appropriate characteristics relative to the amplitude of signals to be outputted, the power consumption and the like. Moreover, if the set maker applies the oscillator to inside predetermined equipment and the amplitude of output signals is set to a large value, certain requirements need to be met as to the distortion of a waveform or the EMI characteristics.

SUMMARY OF THE INVENTION

The present invention has been made in view of the foregoing circumstances and an object thereof is to provide an oscillator capable of outputting variably the amplitude of an oscillation signal and improving distortion characteristics of a waveform.

A preferred embodiment according to the present invention relates to an oscillator. This oscillator includes: an oscillation signal generating circuit which outputs an oscillation signal as a differential signal; a differential amplifier which amplifies the differential signal outputted from the oscillation signal generating circuit; a converter circuit which converts the differential signal amplified by the differential amplifier from a voltage signal to an current signal; and a drive circuit which outputs variably the magnitude of a drive current by which to operate the converter circuit, in accordance with a setting signal inputted externally.

It is preferable that a gain in the "differential amplifier" be set as appropriate in accordance with a circuit. It is assumed that cases when the gain is greater than "1", equal to "1" and less than "1", for instance, are all included.

When the drive current is enlarged by the setting signal inputted to the drive circuit, the converter circuit may be so structured as to enlarge the amplitude of the current signal converted.

By employing the above oscillator, since the differential signals are to be processed, the distortion component contained in a signal is cancel and the distortion of a signal waveform can be reduced. Finally, the magnitude of drive current for converting the voltage signal into the current signal is made to vary and the magnitude of the amplitude in the current signal converted is adjusted. Hence, the conversion efficiency is improved and the power consumption can be made small.

Another preferred embodiment according to the present invention relates also to an oscillator. This oscillator includes: an oscillation signal generating circuit which outputs an oscillation signal as a differential signal; a differential amplifier which amplifies the differential signal outputted from the oscillation signal generating circuit; a converter circuit which converts the differential signal amplified by the differential amplifier from a voltage signal to an current signal; and a drive circuit which outputs variably the magnitude of a drive current by which to operate the differential amplifier, in accordance with a setting signal inputted externally.

When the drive current is enlarged by the setting signal inputted to the drive circuit, the differential amplifier may be so structured as to raise a clock rate thereof.

By employing the above oscillator, the current that unnecessarily flows can be made small by adjusting the magnitude of drive current delivered to the differential amplifier in accordance with the requirement for the magnitude of amplitude in the converted current signal, so that high conversion efficiency can be achieved. Furthermore, when the required amplitude of a current signal is small, the amplitude of a differential signal outputted from the differential amplifier is made small by adjusting the drive current. As a result, any noise which occurs between power supply and ground of the differential amplifier and which is added to the differential signal diminishes and therefore the current signal having the small effect of the noise can be outputted.

It is to be noted that any arbitrary combination of the above-described structural components and expressions mutually replaced by among a method, an apparatus, a system and so forth are all effective as and encompassed by the present embodiments.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

First Embodiment

A first embodiment relates to a high-frequency oscillator so structured that an LSI vendor can produce a general-purpose version capable of generating oscillation signals in such a manner that the magnitude of an amplitude thereof can vary and moreover a so-called set maker can set a predetermined magnitude of amplitude before incorporating it into predetermined equipment. A high-frequency oscillator according to the present embodiment generates the oscillation signal of an oscillation frequency in response to an applied control voltage. The amplitude of the voltage of an oscillation signal is sufficiently amplified by an FET to the degree that a converting FET in a subsequent stage can be switched. Hereinafter, the FET for amplification will be referred to as "amplifying FET". The amplified oscillation signal is converted from a voltage signal to a current signal by the converting FET. In particular, in a high-frequency oscillator according to the present embodiment, the oscillation and amplitude of oscillation signal are based on a differential signal, so that the distortion of signals is cancel and the distortion components of oscillation signal can be reduced. Furthermore, the amplitude of oscillation signal which has been converted to a current is adjusted in a manner such that the magnitude of drive current which is to flow to the converting FET is directly adjusted. Hence, the conversion efficiency is improved and the power consumption can be reduced.

Figure 1:
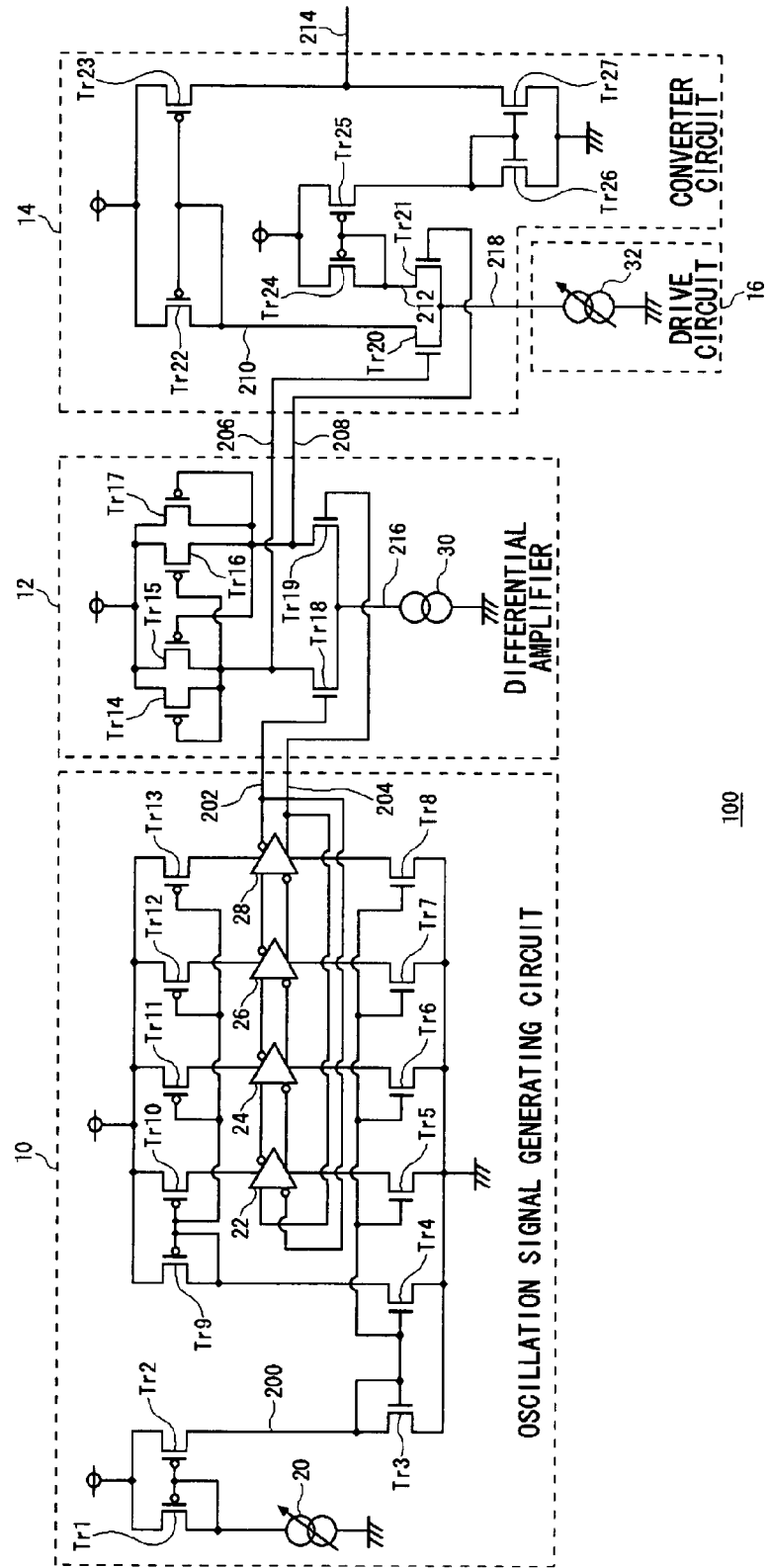
FIG. 1 illustrates a high-frequency oscillator according to a first embodiment of the present invention.

FIG. 1 illustrates a high-frequency oscillator 100 according to the first embodiment of the present invention. The high-frequency oscillator 100 includes an oscillation signal generating circuit 10, a differential amplifier 12, a converter circuit 14 and a drive circuit 16. The oscillation signal generating circuit 10 includes a variable current source 20, a first inverter 22, a second inverter 24, a third inverter 26, a fourth inverter 28 and transistors Tr1 to Tr13. The differential amplifier 12 includes a constant current source 30 and transistors Tr14 to Tr19. The converter circuit 14 includes transistors Tr20 to Tr27. The drive circuit 16 includes a variable current source 32. Signals involved include an oscillator drive current 200, a first generation oscillation signal 202, a second generation oscillation signal 204, a first amplification oscillation signal 206, a second amplification oscillation signal 208, a first current oscillation signal 210, a second current oscillation signal 212, an output current oscillation signal 214, an amplifier drive current 216 and a converting drive current 218.

The oscillation signal generating circuit 10 generates the first generation oscillation signal 202 and the second generation oscillation signal 204, which are differential signals, as oscillation signals. The variable current source 20 delivers the current whose magnitude varies in accordance with a control voltage applied. The transistor Tr1 and the transistor Tr2 constitutes a current mirror circuit, so that the oscillator drive current 200 proportional to the magnitude of a current outputted from the variable current source 20 is delivered thereto.

The transistors Tr3 to Tr8 constitute a current mirror circuit, and the transistors Tr9 to Tr13 constitute a current mirror circuit, too. The current, which is proportional to the oscillator drive current 200, from these current mirror circuits flows to a ring oscillator of a differential output type constituted by the first inverter 22, the second inverter 24, the third inverter 26 and the fourth inverter 28. That is, the larger the oscillator drive current 200, the larger the current flowing to the ring oscillator of a differential output type will become, so that the frequency of the first generation oscillation signal 202 and the second generation oscillation signal 204 outputted from the ring oscillator of a differential output type becomes higher. Here, for example, the first generation oscillation signal 202 and the second generation oscillation signal 204, which present the maximum value and the minimum value thereof repeatedly within a certain period as with a sinusoidal wave, constitute mutually a differential signal. It is to be noted here that a differential signal is called a "balanced signal" whereas a normal signal which is defined by reference to constant potential such as ground is called an "unbalanced signal".

The differential amplifier 12 differentially amplifies the first generation oscillation signal 202 and the second generation oscillation signal 204, respectively, and outputs a first amplification oscillation signal 206 and a second amplification oscillation signal 208. This differential amplification is carried with the purpose of increasing drive capacity at the transistor Tr20 and the transistor Tr21 which will be discussed later. The transistors Tr14 through the transistors Tr19 that constitute the differential amplifier 12 are driven by an amplifier drive current 216 from the constant current source 30 and are applied respectively to gate terminals of the transistor Tr18 and the transistor Tr19 and then differentially amplified, and subsequently the first amplification oscillation signal 206 and the second amplification oscillation signal 208, which are differential signals having waveforms similar to those of the first generation oscillation signal 202 and the second generation oscillation signal 204, are outputted. It is to be noted here that the transistor Tr14 through the transistor Tr19 correspond to the above-mentioned amplifying FETs.

In order to convert the voltage of the first amplification oscillation signal 206 and the second amplification oscillation signal 208 into the current, the variable current source 32 delivers the converting drive current 218 for driving transistor Tr20 and transistor Tr21 discussed later. Though the detailed description will be given later, the value of the converting drive current 218 can be adjusted by adjusting externally a variable resistor value contained in the variable current source 32.

The converter circuit 14 converts the first amplification oscillation signal 206 and the second amplification oscillation signal 208 into an output current oscillation signal 214 in such a form that sink current and source current are alternately switched. From here on, the output current oscillation signal 214 is to be understood to contain the "sink current" arid "source current". The transistor Tr20 converts the first amplification oscillation signal 206 applied to the gate terminal thereof into the first current oscillation signal 210. Here, the transistor Tr20 is n-channel type. Hence, when the first amplification oscillation signal 206 becomes large, the value of the first current oscillation signal 210 gets close to that of the converting drive current 218. The transistor Tr21 operates the same way as the transistor Tr20, and converts the second amplification oscillation signal 208 into the second current oscillation signal 212.

The transistor Tr22 and the transistor Tr23 form a current mirror circuit, and this current mirror circuit converts a first current oscillation signal 210 into a first output current signal which is in proportional to the first current oscillation signal 210. The transistors Tr24 and Tr25 and the transistors Tr26 and Tr27 constitute current mirror circuits, respectively, and these current mirror circuits convert a second current oscillation signal 212 into a second output current signal which is proportional to the second current oscillation signal 212. The first and the second output current signal become an output current oscillation signal 214, in which the aforementioned sink current and source current are switched, by switching between the transistor Tr20 and the transistor Tr21.

Figure 2:
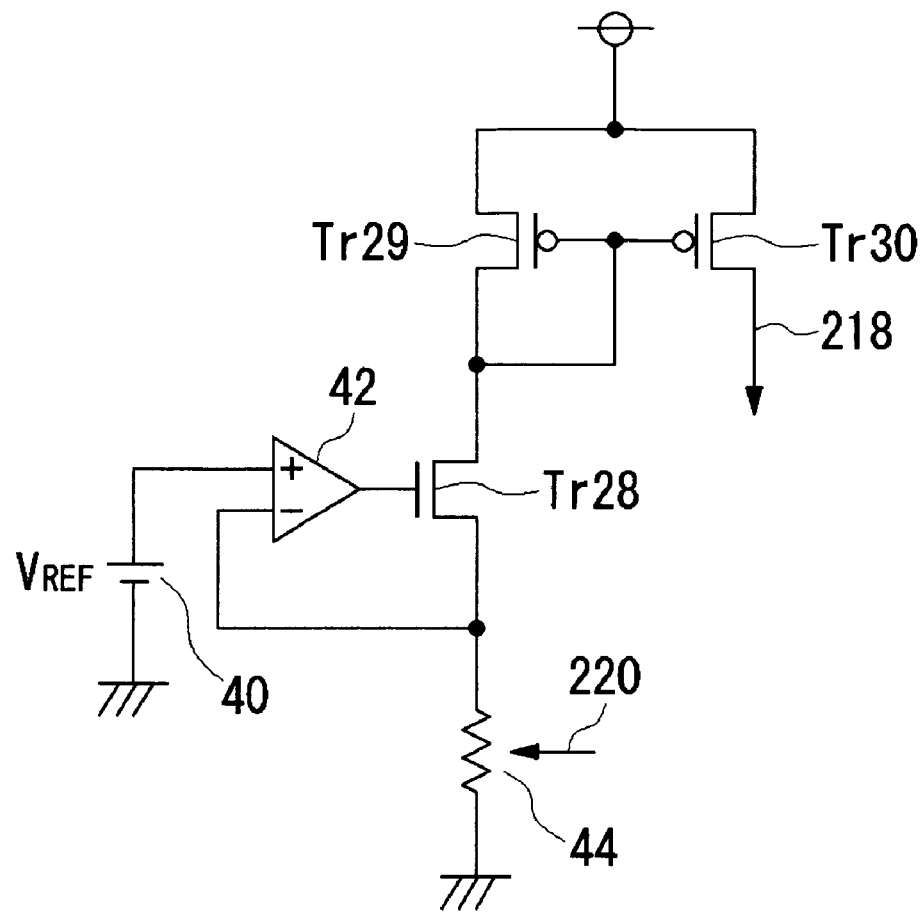
FIG. 2 illustrates a structure of the first variable current source shown in FIG. 1.

FIG. 2 illustrates a structure of a variable current source 32. The variable current source 32 includes a reference voltage source 40, an operational amplifier 42, a variable resistor 44 and transistors Tr28 to Tr30. Signals include a setting signal 220.

The variable resistor 44 is a resistor provided for converting a predetermined constant voltage into current, and the value thereof is adjusted according to a setting signal 220 inputted externally.

The reference voltage source 40, the operational amplifier 42 and the transistor Tr28 stabilize the value of the current converted by the variable resistor 44. Here, since the gate voltage of the transistor Tr28 is amplified by the operational amplifier 42, the transistor Tr28 is used in a saturation region of drain current characteristics.

The transistor Tr29 and the transistor Tr30 form a current mirror circuit, and this current mirror circuit outputs converting drive current 218. That is, changing the value of the variable resistor 44 allows the value of the converting drive current 218 to change as well.

The high-frequency oscillator 100 employing the above-described structure operates as follows. When a control voltage is raised higher, an oscillator drive current 200 flowing from the variable current source 20 becomes larger. When the oscillator drive current 200 becomes larger, a ring oscillator of a differential output type, which is formed by the first inverter 22 to the fourth inverter 28, outputs the first generation oscillation signal 202 and second generation oscillation signal 204 of higher oscillation frequency. The differential amplifier 12 amplifies the first generation oscillation signal 202 and the second generation oscillation signal 204 into a first amplification oscillation signal 206 and a second amplification oscillation signal 208 of a sufficiently large amplitude, respectively.

The transistor Tr20 and the transistor Tr21 convert the first amplification oscillation signal 206 and the second amplification oscillation signal 208 into the first current oscillation signal 210 and the second current oscillation signal 212, respectively. The variable current source 32 delivers to the transistor Tr20 and the transistor Tr21 the converting drive current 218 which is set externally. The transistors Tr22 to Tr27 respectively convert the first current oscillation signal 210 and the second current oscillation signal 212, which will become an output current oscillation signal 214 by the switching of the transistor Tr20 and the transistor Tr21.

Figure 3:
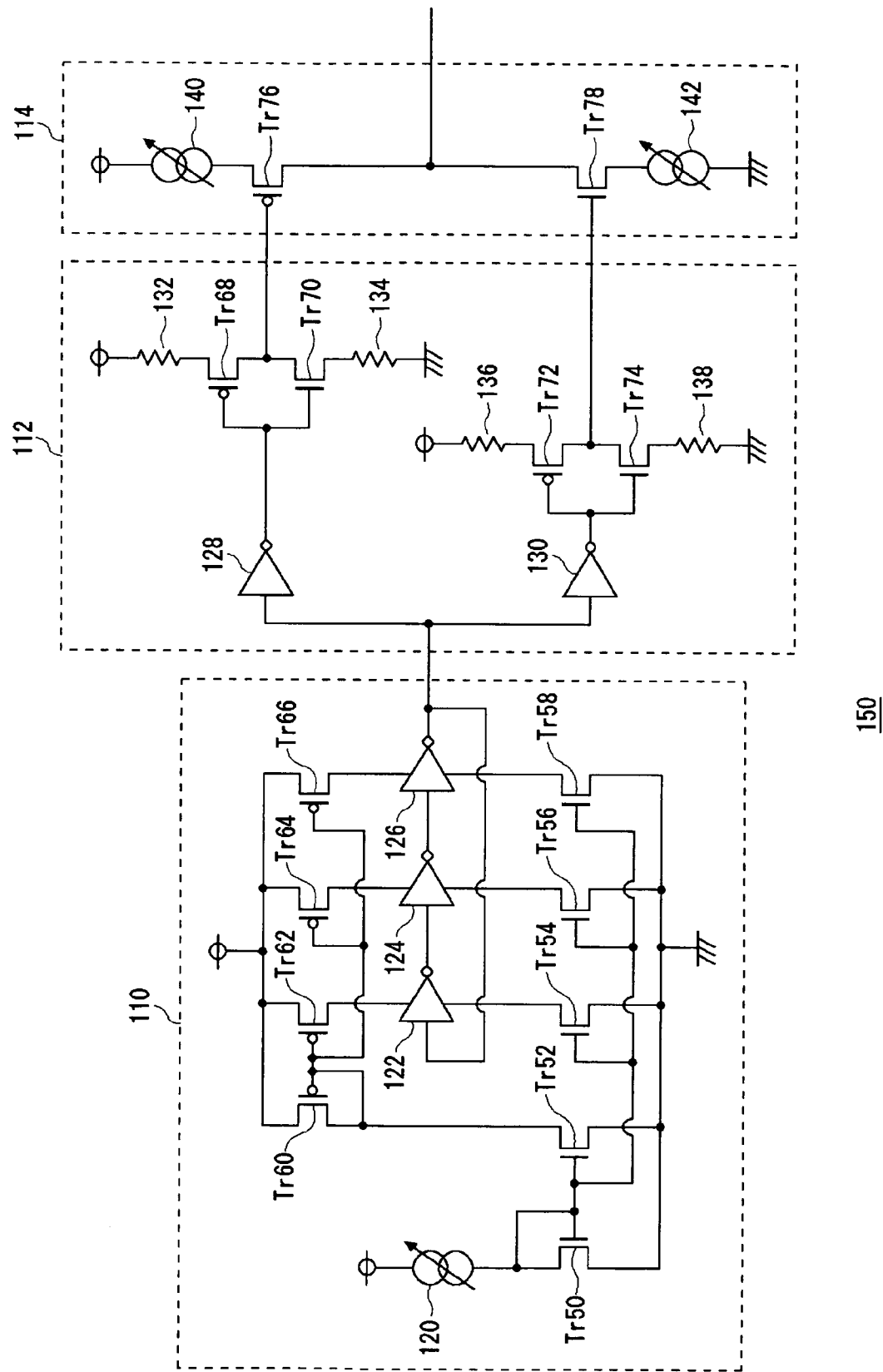
FIG. 3 illustrates a structure of a high-frequency oscillator provided for the comparison with the high-frequency oscillator shown in FIG. 1.

FIG. 3 illustrates a structure of a high-frequency oscillator 150 provided for the comparison in the characteristics with the high-frequency oscillator 100 shown in FIG. 1. The high-frequency oscillator 150 includes an oscillation signal generating circuit 110, a buffer 112 and a converter circuit 114. The oscillation signal generating circuit 110 includes a variable current source 120, a first inverter 122, a second inverter 124, a third inverter 126 and transistors Tr50 to Tr66. The buffer 112 includes a fourth inverter 128, a fifth inverter 130, a first resistor 132, a second resistor 134, a third resistor 136, a fourth resistor 138 and transistors Tr68 to Tr74. The converter circuit 14 includes a variable current source 140, a variable current source 142, a transistor Tr76 and a transistor Tr78.

The oscillation signal generating circuit 110 corresponds to the oscillation signal generating circuit 10 of the high-frequency oscillator 100, and the variable current source 120 delivers the current that varies in accordance with an applied control voltage. The transistor Tr50 through the transistor Tr58 constitute a current mirror circuit whereas the transistor Tr60 through the transistor Tr66 constitute also a current mirror circuit. Through these current mirror circuits, the current proportional to the output current of the variable current source 120 are respectively delivered to a ring oscillator comprised of the first inverter 122, the second inverter 124 and the third inverter 126. And a high-frequency oscillation signal according to the magnitude of the thus delivered current is outputted. Different from the first generation oscillation signal 202 and the second generation oscillation signal 204 of the oscillation signal generating circuit 10, the oscillation signal in the oscillation signal generating circuit 110 for comparison is not a differential signal.

The buffer 112 corresponds to the differential amplifier 12 of the high-frequency oscillator 100, and an oscillation signal outputted from the oscillation signal generating circuit 110 is amplified by the first resistor 132, the transistor Tr68, the transistor Tr70 and the second resistor 134 to such a degree as to raise at least the drive capacity for the transistor Tr76 which will be described later. The fifth inverter 130, the third resistor 136, the transistor Tr72, the transistor Tr74 and the fourth resistor 138 operate the same way as above.

The converter circuit 114, which corresponds to the converter circuit 14 of the high-frequency oscillator 100, converts the oscillation signal amplified by the buffer 112, from a voltage signal to a current signal. Here, the transistor Tr76 is p-channel type and the transistor Tr78 is n-channel type, so that they are turned on alternately by the oscillation signal inputted to the gate thereof. As a result, an oscillation signal in which the sink current and the source current are switched is finally outputted.

Figure 4A:
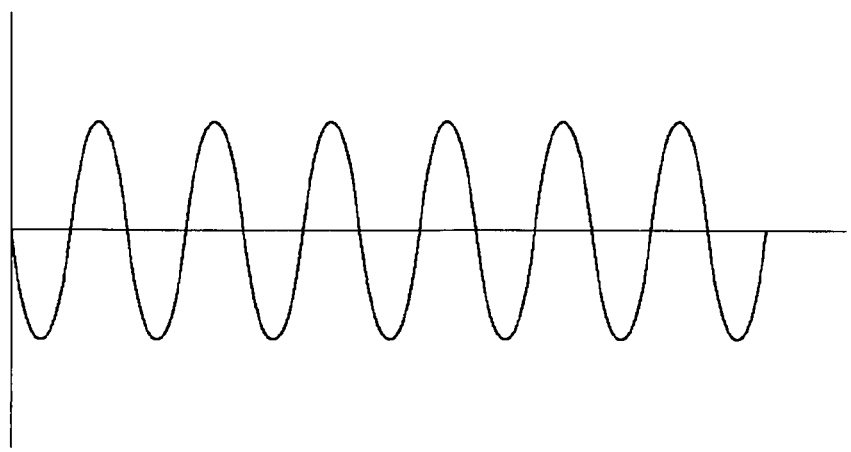
FIGS. 4A and 4B illustrate output waveforms of the high-frequency oscillator circuit shown in FIG. 1 and the high-frequency oscillator shown in FIG. 3, respectively.
Figure 4B:
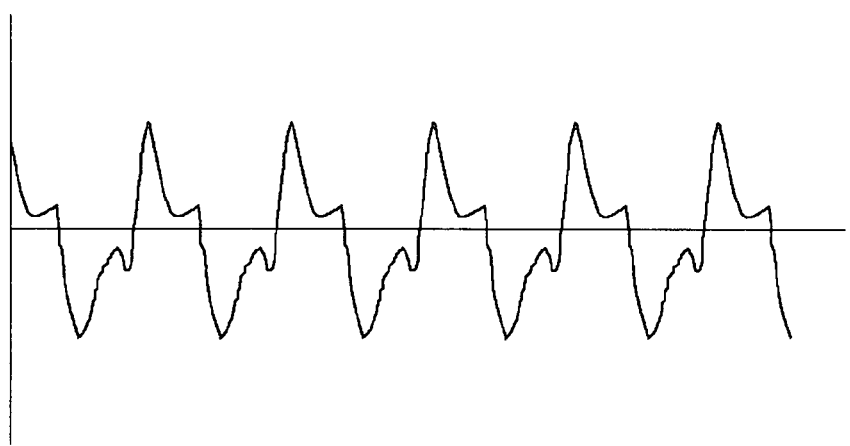

FIGS. 4A and 4B illustrate output waveforms, based on an experimental result, of the high-frequency oscillator 100 shown in FIG. 1 and the high-frequency oscillator 150 shown in FIG. 3, respectively. FIG. 4A shows the output current oscillation signal 214 of the high-frequency oscillator 100 shown in FIG. 1 wherein the oscillation frequency is 344.98 MHz and the amplitude is 42.2 mA and the signal 214 bears a waveform having a small distortion component of a signal. On the other hand, FIG. 4B shows an output of the high-frequency oscillator 150 wherein the oscillation frequency is 283.02 MHz and the amplitude is 40.0 mA both of which are values nearly equivalent to those of FIG. 4A but the waveform of FIG. 4B contains large distortion components compared with that of FIG. 4A. This distortion in the waveform is due to the effect of the error caused at the switching timing of the transistor Tr76 and the transistor Tr78 or it is caused by the fact that the oscillation signal of the ring oscillator included in the high-frequency oscillator 150 is resembling a rectangular waveform and thereby a considerable amount of high-frequency components are contained in the oscillation signal. When FIG. 4A and FIG. 4B of the nearly equivalent oscillation frequency are compared, the signal waveform of FIG. 4B contains a large amount of distortion components and is likely to contain therein the harmonic content of a signal. Thus, the electromagnetic interference (EMI) characteristics of the high-frequency oscillator 100 deteriorate much worse than those of the high-frequency oscillator 100. In contrast thereto, the distortion component of a signal is cancel between differential signals transmitted in the high-frequency oscillator 100 of FIG. 1, so that the distortion component contained in a signal diminishes.

According to the present embodiment, the generation and amplification of oscillation signals are carried out based on the differential signals, so that the distortion component contained in the current signal to be outputted can be made small. As a result of this small signal distortion, a device into which a high-frequency oscillator is incorporated can be operated in a stabilized manner. The amplitude of the current signal to be outputted is adjusted by adjusting the drive current delivered at the stage where the voltage signal is finally converted to the current signal. Hence, the operation efficiency of a circuit is raised and therefore the power consumption is lowered.

Second Embodiment

A second embodiment relates to a high-frequency oscillation circuit having a similar structure to the first embodiment in which the magnitude of drive current delivered to the converting FET is variably adjusted by an external setting signal. In the second embodiment, however, the magnitude of drive current delivered to an amplifying FET is variably adjusted by an external setting signal. A high-frequency oscillation circuit according to the present embodiment varies the magnitude of a voltage signal for switching a converting FET by adjusting the magnitude of drive current delivered to the amplifying FET included in a differential amplifier, so as to vary the magnitude of a current signal to be finally outputted. When drive current is made small, the magnitude of a differential signal outputted from the differential amplifier becomes small. As a result, any noise which occurs between power supply and ground of the differential amplifier and which is added to the differential signal diminishes.

Figure 5:
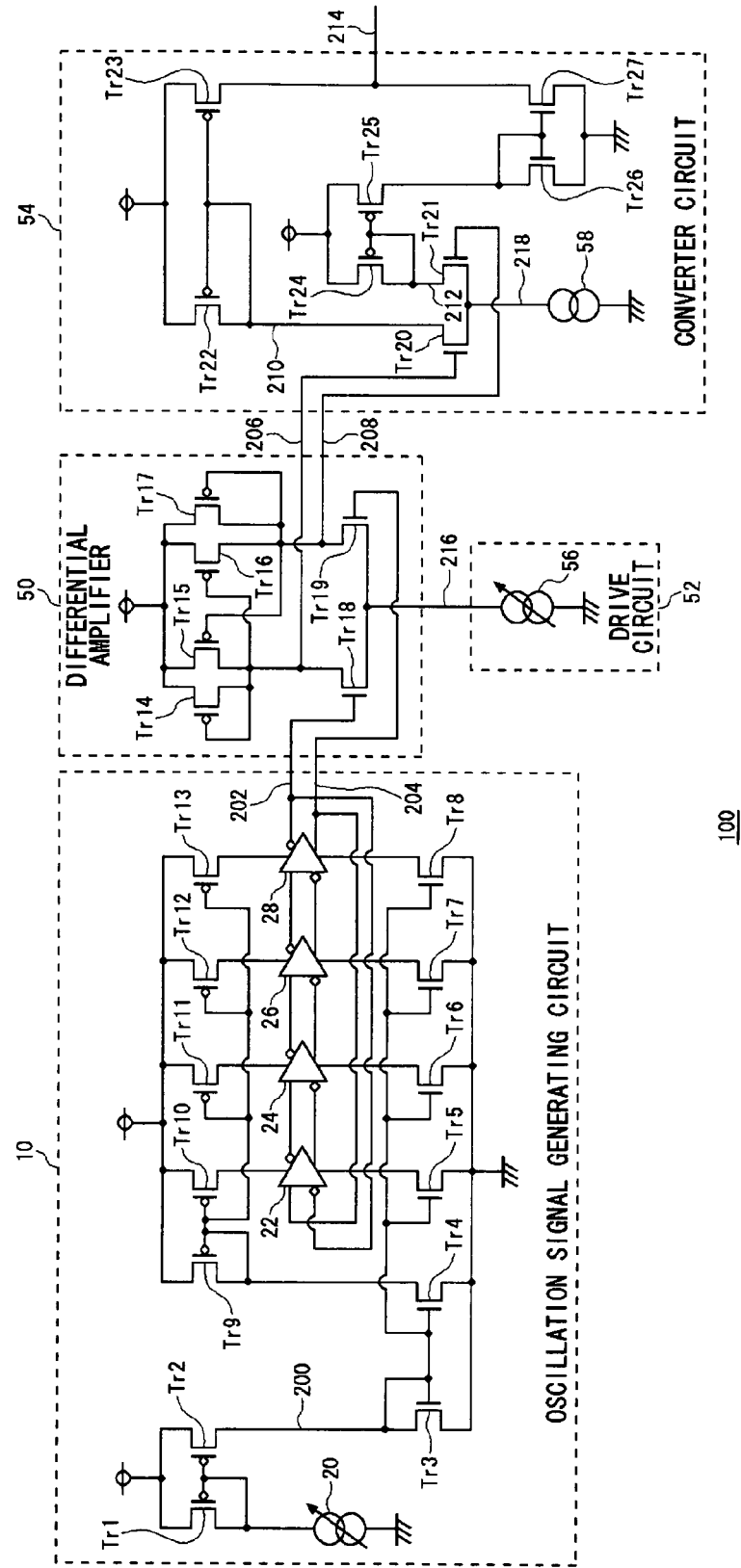
FIG. 5 illustrates a high-frequency oscillator according to a second embodiment of the present invention.

FIG. 5 illustrates a structure of a high-frequency oscillator 100 according to the second embodiment. A differential amplifier 50, a drive circuit 52 and a converter circuit 54 included in the high-frequency oscillator 100 of FIG. 5 differ from the differential amplifier 12, the converter circuit 14 and the drive circuit 16 included in the high-frequency oscillator 100 of FIG. 1. The differential amplifier 50 is such that the constant current source 30 is removed from the differential amplifier 12. The converter circuit 54 is such that a constant current source 58 is added in the converter circuit 14. And a newly added drive circuit 52 includes a variable current source 56.

Similar to the constant current source 30 of FIG. 1, the variable current source 56 delivers an amplifier drive current 216 to the differential amplifier 50. Here, the variable current source 56 has a similar structure to the variable current source 32 of FIG. 2 and can adjust the magnitude of an amplifier drive current 216 by adjusting a value of a variable resistor 44 (not shown) contained inside thereof with a setting signal 220 (not shown) provided externally.

The converter circuit 54 converts a first amplification oscillation signal 206 and a second amplification oscillation signal 208 into an output current oscillation signal 214 in which sink current and source current are switched. Since the magnitude of converting drive current 218 delivered to a transistor Tr20 and a transistor Tr21 which are used to convert from voltage signals to current signals is determined based on the constant current source 58, it is fixed.

In FIG. 5, when the magnitude of the output current oscillation signal 214 is to be adjusted, the magnitude of converting drive signal 218 to be delivered to the transistor Tr20 and the transistor Tr21 are not directly adjusted. Instead, the magnitude of amplifier drive current 216 to be delivered to the differential amplifier 50 is adjusted based on the external setting signal so as to adjust the magnitude of the output current oscillation signal 214. By employing the above structure, the magnitude of the amplifier drive current 216 can be made as small as necessary. As a result, any noise which occurs between power supply and ground of the differential amplifier 50 and the drive circuit 52 and which is added to a first amplification oscillation signal 206 and a second amplification oscillation signal 208 can be reduced, and an output current oscillation signal 214 having the small effect of the noise can be outputted.

The high-frequency oscillator 100 employing the above-described structure operates as follows. When a control voltage is raised higher, an oscillator drive current 200 flowing from a variable current source 20 becomes larger, too. When the oscillator drive current 200 becomes larger, a ring oscillator of a differential output type, which is formed by a first inverter 22 to a fourth inverter 28, outputs first generation oscillation signal 202 and second generation oscillation signal 204 of higher oscillation frequency. The differential amplifier 50 amplifies the first generation oscillation signal 202 and the second generation oscillation signal 204 into first amplification oscillation signal 206 and second amplification oscillation signal 208 of a sufficiently large amplitude, respectively.

The variable current source 56 delivers to transistors Tr18 and Tr19 the amplifier drive current 216 which is in accordance with an external setting, in order to meet the clock rate required of the differential amplifier 50. The transistor Tr20 and the transistor Tr21 convert the first amplification oscillation signal 206 and the second amplification oscillation signal 208 into a first current oscillation signal 210 and a second current oscillation signal 212, respectively. The constant current source 58 delivers a converting drive current 218 to the transistor Tr20 and the transistor Tr21. Transistors Tr22 through Tr27 convert respectively the values of the first current oscillation signal 210 and the second current oscillation signal 212 which will become an output current oscillation signal 214 by the switching of the transistor Tr20 and the transistor Tr21.

According to the present embodiment, the generation and amplification of oscillation signals are carried out based on the differential signals, so that the distortion component of a signal can be reduced. Furthermore, if the drive current to be delivered to the differential amplifier is made small, then the current signal having the small effect of noise can be outputted.

Third Embodiment

In this third embodiment, a structure of apparatus or LSIs to which a high-frequency oscillator according to the first or second embodiment is applied will be described.

Figure 6A:
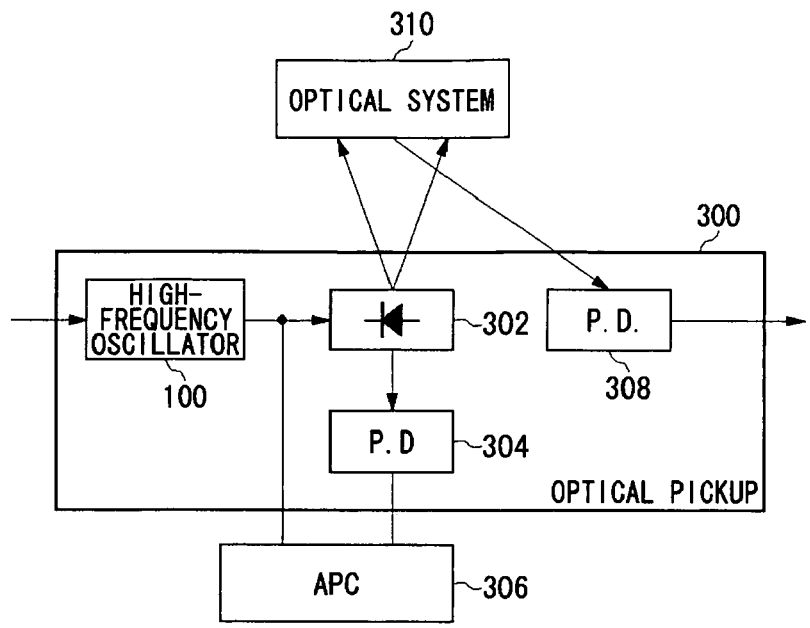
FIGS. 6A, 6B and 6C illustrate applied examples of high-frequency oscillators according to a third embodiment of the present invention.

FIG. 6A illustrates a structure of an optical pickup 300 among applied examples of the high-frequency oscillator 100 according to the third embodiment. The optical pickup 300 includes a high-frequency oscillator 100, a semiconductor laser chip 302, a photodiode 304 for use with a monitor and a light receiving photodiode 308. The optical pickup 300 reads signals out of or write them to a disk, which is a recording medium, in information record/reproduce equipment such as an optical disk device or magneto-optical disk device.

The semiconductor laser chip 302 emits laser beams in response to current supplied from a high-frequency oscillator 100 described later. Based on a control signal indicated by voltage from an automatic power control (APC) circuit 306 described later, the high-frequency oscillator 100 supplies current signals to the semiconductor laser chip 302.

An optical system 310 irradiates a disk (not shown), which is a recording medium, as a light spot, with a laser beam emitted from the semiconductor laser chip 302 and directs light reflected from the disk to the light receiving photodiode 308 described later.

The light receiving photodiode 308 converts the reflected light into current signals. Then the current signal is further converted into a voltage signal. The photodiode 304 for use with a monitor converts part of laser beams emitted from the semiconductor laser chip 302 into current signals. It is to be noted that "part of laser beams" here are those emitted from a side where the optical system 310 is not provided.

Based on a current signal outputted from the photodiode 304 for use with a monitor, the APC circuit 306 outputs the control signal to the high-frequency oscillator 100 so that the laser beam is constantly outputted at a constant power from the semiconductor laser chip 302. That is, the APC circuit 106 performs a feedback control of the semiconductor laser chip 302. The APC circuit 306 is provided for a reason described hereinbelow. The level of voltage signals outputted from the optical pickup 300 needs to be kept at a predetermined level. However, the power of laser beams that the semiconductor laser chips 302 outputs differs for each chip and is susceptible to the change of temperature. Thus, controlling the semiconductor laser chips 302 in a single uniform way does not result in a constant power of the laser beams, so that the output level of voltage signals cannot be held at a constant level.

As described in the first and second embodiments above, the high-frequency oscillator 100 can enlarge the amplitude of the output current oscillation signal 214. Thus, the semiconductor laser chip 302 can emit laser beams in a stabilized manner.

Figure 6B:
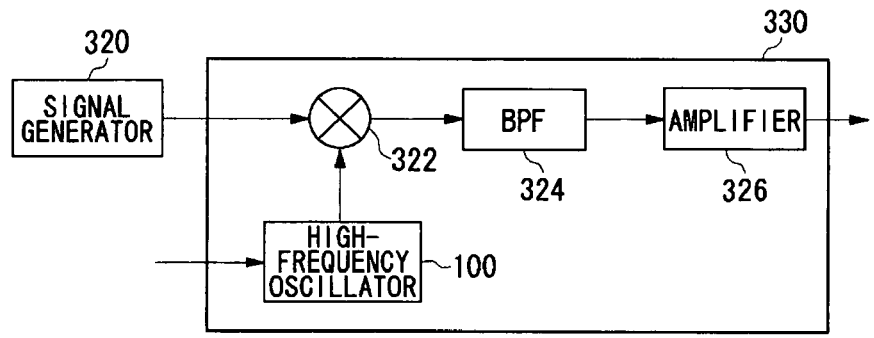

FIG. 6B illustrates a structure of a frequency converter circuit 330 among applied examples of the high-frequency oscillators 100 according to the third embodiment. The frequency converter circuit 330 includes a high-frequency oscillator 100, a multiplier circuit 322, a band-pass filter (BPF) 324 and an amplifier 326. In a communication apparatus the frequency converter circuit 330 converts signals to be sent into signals for transmission. More specifically, in a radio transmitting apparatus a baseband signal to transmitted or an intermediate frequency signal where the baseband signal is frequency-converted is frequency-converted into a radio frequency signal.

A signal generator 120 generates, as baseband signals, the signal to be transmitted and frequency-converts the baseband signals into intermediate frequencies.

The high-frequency oscillator 100 inputs voltage according to the radio frequency used for the transmission and outputs radio frequency signals.

The multiplier circuit 322 frequency-converts the intermediate frequency signals by the radio frequency signals. The BPF 324 reduces the effect of the harmonic content generated by the frequency conversion.

In order to transmit the output signals of BPF 324 on a radio propagation path, the amplifier 326 amplifies them up to a predetermined power.

Here, since the high-frequency oscillator 100 can output the current signal of a large value according to a setting even at a high oscillation frequency as described in the first and second embodiments above, the frequency converter circuit 330 can stably output the radio frequency signals.

Figure 6C:
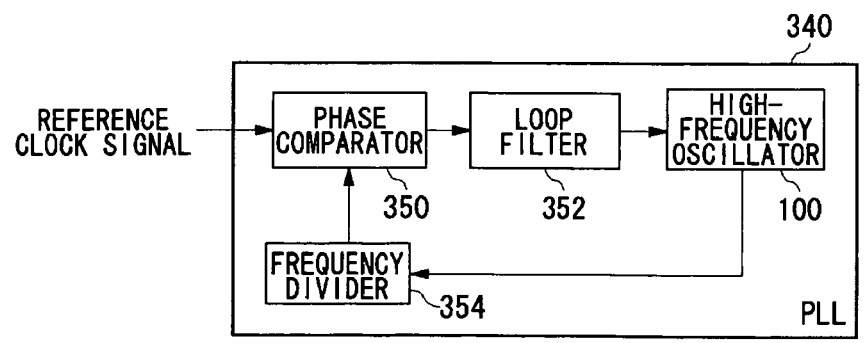

FIG. 6C illustrates a structure of a PLL 340 among applied examples of the high-frequency oscillators according to the third embodiment. The PLL 340 includes a high-frequency oscillator 100, a phase comparator 350, a loop filter 352 and a frequency divider 354.

The phase comparator 350 compares the phase and frequency of a reference clock signal inputted externally with those of a reference clock signal inputted from the frequency divider 354, and outputs a direct-current signal proportional to the difference thereof. The loop filter 352 removes the high-frequency components of inputted signals and outputs a control voltage. The high-frequency oscillator 100 outputs a clock signal having a frequency according to the control voltage inputted. Outputted here is a clock signal having a frequency which is N times the frequency of the reference clock signal. The frequency divider 354 divides the frequency of the outputted clock signal by N so as to be inputted to the phase comparator 350 as a reference clock signal.

According to the present embodiment, the amplitude of output current signal can be adjusted. And the high-frequency oscillator which can reduce the distortion component of a signal can be applied to various devices and LSIs.

The present invention has been described based on the embodiments which are only exemplary. It is therefore understood by those skilled in the art that other various modifications to the combination of each component and process described above are possible and that such modifications are also within the scope of the present invention.

In the first and second embodiments, the differential amplifier 12 and the differential amplifier 50 are each constituted by a single differential amplifier. However the structure thereof is not limited thereto and, for example, it may be comprised of a plurality of differential amplifiers. According to this modified example, the amplitudes of the first amplification oscillation signal 206 and the second amplification oscillation signal 208 can be further enlarged. That is, there may be provided the differential amplifiers the number of which is in accordance with the values required by the first amplification oscillation signal 206 and the second amplification oscillation signal 208 which are outputted from the differential amplifier 12 or the differential amplifier 50.

In the first embodiment, the drive circuit 16 outputs variably the magnitude of the converting drive current 218 which is to be delivered to the converter circuit 14, according to the external setting signal 220. In the second embodiment, the drive circuit 52 outputs variably the magnitude of the amplifier drive current 216 which is to be delivered to the differential amplifier 50, according to the external setting signal 220. However, the arrangement is not limited thereto and may be in such a form that both are combined. In such a case, the drive circuit 16 outputs variably the magnitude of the converting drive current 218 which is to be delivered to the converter circuit 14, according to the external setting signal 220 and at the same time the drive circuit 52 outputs variably the magnitude of the amplifier drive current 216 which is to be delivered to the differential amplifier 50, according to the external setting signal 220. According to this modified example, further detailed and fine-tuned control is possible. That is, it suffices that the magnitude of amplitude, the distortion component and the power consumption in the output current oscillation signal 214 required by the high-frequency oscillator 100 are met.

Although the present invention has been described by way of exemplary embodiments and modified examples, it should be understood that many changes and substitutions may further be made by those skilled in the art without departing from the scope of the present invention which is defined by the appended claims.

What is claimed is:

1. An oscillator, comprising:
    an oscillation signal generating circuit which outputs a pair of oscillating voltage signals in opposite phase;
    a differential amplifier which amplifies the pair of oscillating voltage signals into a pair of amplified oscillating voltage signals in oppose phase; and
    a converter circuit which includes a first transistor for sourcing a current and a second transistor, connected in series with the first transistor, for sinking a current, the first and second transistors being controlled by the pair of amplified oscillating voltage signals, respectively, to output at the connection point between the first and the second transistors a combined oscillating output current.

2. An oscillator according to claim 1, further comprising a drive circuit which outputs variably the magnitude of a drive current by which to operate said converter circuit, in accordance with a setting signal inputted externally.

3. An oscillator according to claim 1, further comprising a drive circuit which outputs variably the magnitude of a drive current by which to operate said differential amplifier, in accordance with a setting signal inputted externally.

4. An oscillator according to claim 2, wherein when the drive current is enlarged by the setting signal inputted to said drive circuit, said converter circuit is so structured as to enlarge an amplitude of the current signal converted by said converter circuit.

5. An oscillator according to claim 2, wherein said drive circuit includes:
    a variable resistor which adjusts a value of resistance in accordance with the setting signal and which converts a predetermined constant voltage into a current by the adjusted value of resistance; and
    an output circuit which stabilizes the current converted by the variable resistor and then outputs the stabilized current as a drive current.

6. An oscillator according to claim 4, wherein said drive circuit includes:
    a variable resistor which adjusts a value of resistance in accordance with the setting signal and which converts a predetermined constant voltage into a current by the adjusted value of resistance; and
    an output circuit which stabilizes the current converted by the variable resistor and then outputs the stabilized current as a drive current.

7. An oscillator according to claim 3, wherein when the drive current is enlarged by the setting signal inputted to said drive circuit, said differential amplifier is so structured as to raise a clock rate thereof.

8. An oscillator according to claim 3, wherein said drive circuit includes:
    a variable resistor which adjusts a value of resistance in accordance with the setting signal and which converts a predetermined constant voltage into a current by the adjusted value of resistance; and
    an output circuit which stabilizes the current converted by the variable resistor and then outputs the stabilized current as a drive current.

9. An oscillator according to claim 7, wherein said drive circuit includes:
    a variable resistor which adjusts a value of resistance in accordance with the setting signal and which converts a predetermined constant voltage into a current by the adjusted value of resistance; and
    an output circuit which stabilizes the current converted by the variable resistor and then outputs the stabilized current as a drive current.

* * * * *